(12) United States Patent
Jin et al.

(10) Patent No.: US 12,332,810 B1
(45) Date of Patent: Jun. 17, 2025

(54) ELECTRONIC DEVICE HAVING A PLURALITY OF CHIPLETS

(71) Applicant: REBELLIONS INC., Seongnam-si (KR)

(72) Inventors: Young-Jae Jin, Seongnam-si (KR); Miock Chi, Seongnam-si (KR); Sanggyu Park, Seongnam-si (KR); Chang-Hyo Yu, Seongnam-si (KR); Changsoo Ha, Seongnam-si (KR); Jaewan Bae, Seongnam-si (KR)

(73) Assignee: REBELLIONS INC., Seongnam-si (KR)

( * ) Notice: Subject to any disclaimer, the term of this patent is extended or adjusted under 35 U.S.C. 154(b) by 0 days.

(21) Appl. No.: 18/939,311

(22) Filed: Nov. 6, 2024

(30) Foreign Application Priority Data

Dec. 28, 2023 (KR) .................. 10-2023-0195639

(51) Int. Cl.
  *G06F 13/14* (2006.01)
  *G06F 11/30* (2006.01)
  *G06F 13/28* (2006.01)
  *G06F 13/36* (2006.01)
  *G06F 13/40* (2006.01)

(52) U.S. Cl.
  CPC .......... *G06F 13/14* (2013.01); *G06F 11/3006* (2013.01); *G06F 11/3051* (2013.01); *G06F 13/28* (2013.01); *G06F 13/36* (2013.01); *G06F 13/409* (2013.01); *G06F 2213/0026* (2013.01)

(58) Field of Classification Search
  CPC .......... G06F 13/14; G06F 13/28; G06F 13/36; G06F 11/3006; G06F 11/3051; G06F 13/409; G06F 2213/0026
  See application file for complete search history.

(56) References Cited

U.S. PATENT DOCUMENTS

| | | | | |
|---|---|---|---|---|
| 11,669,474 | B1 * | 6/2023 | Lee | ........................... G06F 1/10 710/11 |
| 2023/0080284 | A1 | 3/2023 | Lee | |
| 2024/0030172 | A1 * | 1/2024 | Das Sharma | ........... H01L 24/16 |
| 2024/0220438 | A1 * | 7/2024 | Loh | ..................... H01L 25/0655 |
| 2024/0311330 | A1 * | 9/2024 | Das Sharma | ....... G06F 13/4295 |

FOREIGN PATENT DOCUMENTS

| | | |
|---|---|---|
| KR | 10-2023-0038082 A | 3/2023 |
| WO | 2023/121812 A1 | 6/2023 |
| WO | WO-2024205614 A1 * 10/2024 ....... G01R 31/31705 |

* cited by examiner

*Primary Examiner* — Glenn A. Auve
(74) *Attorney, Agent, or Firm* — BROADVIEW IP LAW, PC

(57) ABSTRACT

Provided is an electronic device, including a first chiplet including a first bus interface, a first interconnect management module, and a first interconnect module, and a second chiplet connected to the first chiplet through the first interconnect module, wherein, in response to an occurrence of a request transaction associated with the second chiplet, the first interconnect management module stores, in a register, first information associated with the request transaction.

18 Claims, 10 Drawing Sheets

ELECTRONIC DEVICE HAVING A PLURALITY OF CHIPLETS

CROSS-REFERENCE TO RELATED APPLICATIONS

This application claims priority under 35 U.S.C § 119 to Korean Patent Application No. 10-2023-0173828 filed on Dec. 4, 2023, and Korean Patent Application No. 10-2023-0195639 filed on Dec. 28, 2023, in the Korean Intellectual Property Office, the entire contents of which are hereby incorporated by reference.

BACKGROUND

Field

The present disclosure relates to an electronic device including a plurality of chiplets.

Description of the Related Art

The demand for high performance and miniaturization of semiconductor devices and electronic products using the same has increased, leading to the development of various packaging technologies related to the semiconductor devices. Along with the development of these technologies, packaging technologies using chiplets have recently emerged.

Chiplet system may refer to a system that is provided by, rather than configuring chips performing various functions on one die (or substrate), dividing the chips in units of functionalities, configuring the divided chips on each of a plurality of dies (chiplet), and packaging them into one system. That is, the chiplet system was developed to overcome the limitations of existing monolithic chips, and since the chiplets can be miniaturized in units of functionalities, it is possible to overcome the size limitation of reticles, that is, the templates that print circuits on wafer surfaces using light in the photo process of semiconductors. In addition, since the yield of semiconductor manufacturing tends to be inversely proportional to the area, using the chiplets can increase the yield of semiconductor manufacturing and also reduce manufacturing costs. Accordingly, in recent years, there is an increasing demand for using the chiplet when manufacturing electronic products.

SUMMARY

In order to solve one or more problems (e.g., the problems described above and/or other problems not explicitly described herein), the present disclosure provides an electronic device including a plurality of chiplets.

The present disclosure may be implemented in a variety of ways, including methods, devices (systems) and/or computer programs stored in computer readable storage media.

An electronic device includes a first chiplet including a first bus interface, a first interconnect management module, and a first interconnect module, and a second chiplet connected to the first chiplet through the first interconnect module, in which, in response to an occurrence of a request transaction associated with the second chiplet, the first interconnect management module may store first information associated with the request transaction in a register.

The first information may include information associated with a first time of occurrence of the request transaction in the first interconnect management module, and the first interconnect management module may determine occurrence or non-occurrence of a request transaction timeout in the first chiplet, based on whether a transfer of the request transaction is completed before a first threshold time elapses since the first time.

The request transaction may be a burst transaction transferred with a burst transfer method, and the request transaction timeout may occur in response to a part of the burst transactions not being transferred.

In response to determining that the request transaction timeout occurs in the first chiplet, the first bus interface may be determined as a debugging point candidate.

The request transaction may be transferred to the second chiplet through the first interconnect module.

The first information may include information associated with a first time of occurrence of the request transaction, the first interconnect management module may determine occurrence or non-occurrence of a response transaction timeout in the first chiplet, based on whether a transfer of a response transaction corresponding to the request transaction is completed before a second threshold time elapses since the first time, and the response transaction may be transferred from the second chiplet to the first chiplet through the first interconnect module.

The response transaction may be a burst transaction transferred with a burst transfer method, and the response transaction timeout may occur in response to all or part of the burst transaction not being transferred.

In response to determining the occurrence of the response transaction timeout in the first chiplet, the first interconnect module may be determined as a debugging point candidate.

The second chiplet may include a second bus interface, a second interconnect management module, and a second interconnect module, and in response to the occurrence of the request transaction, the second interconnect management module may store, in a register, second information associated with the request transaction.

The second information may include information associated with a second time of occurrence of the request transaction occurs in the second interconnect management module, and the second interconnect management module may determine occurrence or non-occurrence of a request transaction timeout in the second chiplet, based on whether a transfer of the request transaction is completed before a third threshold time elapses since the second time.

In response to determining the occurrence of the request transaction timeout in the second chiplet, the second interconnect module may be determined as a debugging point candidate.

The second information may include information associated with a second time of occurrence of the request transaction occurs in the second interconnect management module, and the second interconnect management module may determine occurrence or non-occurrence of a response transaction timeout in the second chiplet, based on whether a transfer of a response transaction corresponding to the request transaction is completed before a fourth threshold time elapses since the second time.

In response to determining the occurrence of the response transaction timeout in the second chiplet, the second bus interface may be determined as a debugging point candidate.

In response to occurrence of a timeout associated with the request transaction in the first chiplet or second chiplet, a transfer of the request transaction is initiated again in the chiplet where the timeout occurs.

The first interconnect module may be configured to communicate based on a first protocol, and at least one of the first chiplet or the second chiplet may include a second interconnect module, which is configured to communicate with a host based on the second protocol.

The first interconnect module may be a Universal Chiplet Interconnect Express (UCIe) module, and the second interconnect module may be a peripheral component interconnect express (PCIe) module.

An interrupt signal may be transferred to the host in response to an occurrence of a transaction timeout in at least one of the first or second chiplets.

In response to receiving the interrupt signal, the host may access a register associated with an interconnect management module of the chiplet where the transaction timeout occurs.

A register associated with an interconnect management module of the chiplet where the timeout occurs may include at least one of: information associated with the chiplet where the timed-out transaction is generated; information associated with an interconnect management module of the chiplet where the transaction is generated; or information associated with a bus interface through which the transaction is passed.

The first bus interface may be an advanced eXtensible interface (AXI) type interface.

According to some aspects of the present disclosure, the chiplet system can process the distributed works in parallel, thereby optimizing and increasing the overall performance of the system including the host and the chiplet system, and further, a scalable computing environment can be provided.

According to some aspects of the present disclosure, by performing the transaction tracking process using the registers of the interconnect management modules included in each of the chiplets, it is possible to determine where the timeout occurs, and accurately determine a debugging point according to the timeout.

The effects of the present disclosure are not limited to the effects described above, and other effects not described herein can be clearly understood by those of ordinary skill in the art (referred to as "ordinary technician") from the description of the claims.

BRIEF DESCRIPTION OF THE DRAWINGS

The above and other objects, features and advantages of the present disclosure will be described with reference to the accompanying drawings described below, where similar reference numerals indicate similar elements, but not limited thereto, in which.

DETAILED DESCRIPTION

Figure 1:
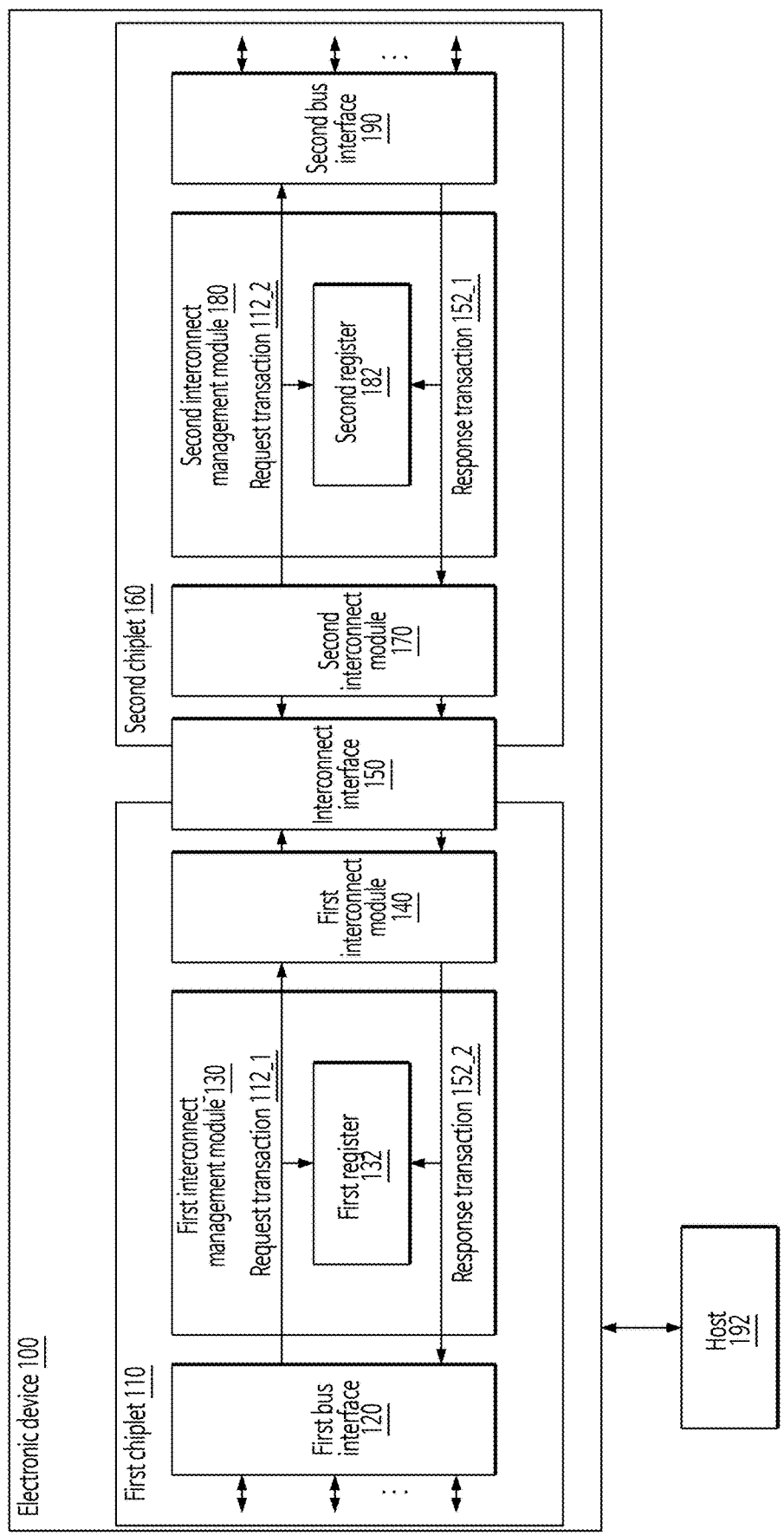
FIG. 1 is a diagram provided to explain a configuration of an electronic device including a plurality of chiplets.

Hereinafter, example details for the practice of the present disclosure will be described in detail with reference to the accompanying drawings. However, in the following description, detailed descriptions of well-known functions or configurations will be omitted if it may make the subject matter of the present disclosure rather unclear.

In the accompanying drawings, the same reference numerals are assigned to the same or corresponding components. In addition, in the description of the following aspects, overlapping descriptions of the same or corresponding components may be omitted. However, even if the description of the component is omitted, it is not intended that such a component is not included in any aspect.

Advantages and features of the disclosed examples and methods of accomplishing the same will be apparent by referring to examples described below in connection with the accompanying drawings. However, the present disclosure is not limited to the examples disclosed below, and may be implemented in various forms different from each other, and the examples are merely provided to make the present disclosure complete, and to fully disclose the scope of the disclosure to those skilled in the art to which the present disclosure pertains.

The terms used herein will be briefly described prior to describing the disclosed example(s) in detail. The terms used herein have been selected as general terms which are widely used at present in consideration of the functions of the present disclosure, and this may be altered according to the intent of an operator skilled in the art, related practice, or introduction of new technology. In addition, in specific cases, certain terms may be arbitrarily selected by the applicant, and the meaning of the terms will be described in detail in a corresponding description of the example(s). Therefore, the terms used in the present disclosure should be defined based on the meaning of the terms and the overall content of the present disclosure rather than a simple name of each of the terms.

The singular forms "a," "an," and "the" as used herein are intended to include the plural forms as well, unless the context clearly indicates the singular forms. Further, the plural forms are intended to include the singular forms as well, unless the context clearly indicates the plural forms. Throughout the description, when a portion is stated as "comprising (including)" an element, unless specified to the contrary, it intends to mean that the portion may additionally include another element, rather than excluding the same.

In addition, the term "module" or "unit" used in the specification refers to a software or hardware component, and the "module" or "unit" performs certain roles. However, the meaning of the "module" or "unit" is not limited to software or hardware. The "module" or "unit" may be configured to be in an addressable storage medium or configured to play one or more processors. Thus, as an example, the "module" or "unit" may include components such as software components, object-oriented software components, class components, and task components, and at least one of processes, functions, attributes, procedures, subroutines, segments of program code, drivers, firmware, microcode, circuitry, data, database, data structures, tables, arrays, or variables. Components and "modules" or "units" may be combined into a smaller number of components and "modules" or "units" or further separated into additional components and "modules" or "units".

The "module" or "unit" may be implemented as a processor and a memory. The "processor" should be interpreted broadly to encompass a general-purpose processor, a Central Processing Unit (CPU), a microprocessor, a Digital Signal Processor (DSP), a controller, a microcontroller, a state machine, and so forth. Under some circumstances, the "processor" may refer to an application-specific integrated circuit (ASIC), a programmable logic device (PLD), a field-programmable gate array (FPGA), and so on. The "processor" may refer to a combination for processing devices, e.g., a combination of a DSP and a microprocessor, a combination of a plurality of microprocessors, a combination of one or more microprocessors in conjunction with a DSP core, or any other combination of such configurations. In addition, the "memory" should be interpreted broadly to encompass any electronic component that is capable of storing electronic information. The "memory" may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or marking data storage, registers, etc. The memory is said to be in electronic communication with a processor if the processor can read information from and/or to the memory. The memory integrated with the processor is in electronic communication with the processor.

In addition, terms such as first, second, A, B, (a), (b), etc. used in the following examples are only used to distinguish certain components from other components, and the nature, sequence, order, etc. of the corresponding components are not limited by the terms.

In addition, in the following aspects, if one component is described to be "connected", "coupled", or "attached" to another component, it should be understood that the one component may be directly connected or attached to another component, or yet another component may be "connected", "coupled", or "attached" between each of the components.

In addition, the words "comprises" and/or "comprising" as used herein means that the components, steps, operations, and/or elements mentioned do not exclude the presence or addition of one or more other components, steps, operations, and/or elements.

In addition, in the following examples, "each of a plurality of A's" may refer to each of all components included in the plurality of A's, or may refer to each of some of the components included in the plurality of A's.

In the present disclosure, a "chiplet" is an integrated circuit (IC) block and may be a type of semiconductor device that is coupled, connected, and combined with another chiplet to configure one package.

In the present disclosure, a "debugging point" may refer to a specific location in a system to identify and resolve bugs or malfunctions.

In the present disclosure, a "source node" may refer to a chiplet or a part of a chiplet where the transfer of specific information or data (e.g., transaction) starts.

In the present disclosure, a "relay node" may refer to a chiplet or a part of a chiplet that receives information or data from a source node or other relay node and transmits the information to another relay node or a destination node, and a "destination node" may refer to a chiplet or a part of a chiplet that receives information or data from a source node or relay node and processes the same.

The dies in the chiplet system may be connected to each other through a silicon interposer and communicate with each other according to a die-to-die communication standard such as Universal Chiplet Interconnect Express (UCIe). Timeout may occur when transmitting and receiving a specific transaction between the dies in the chiplet system. The timeout may temporarily occur due to a bottleneck of a communication channel, etc., but may also occur due to a communication failure such as disconnection or communication degradation. Therefore, it is necessary to determine if a timeout occurs, where it occurs, etc., and solve the problem through appropriate diagnosis based on this.

Hereinafter, various aspects of the present disclosure will be described in detail with reference to the accompanying drawings.

FIG. 1 is a diagram provided to explain a configuration of an electronic device 100 including a plurality of chiplets 110 and 160. The electronic device 100 may include a first chiplet 110 and a second chiplet 160, and may be connected to a host 192. Although the first chiplet 110 and the second chiplet 160 are illustrated in FIG. 1 for convenience of description, aspects are not limited thereto, and the electronic device 100 may include any number of chiplets.

As illustrated, the first chiplet 110 may include a first bus interface 120, a first interconnect management module 130, and a first interconnect module 140. The second chiplet 160 may include a second interconnect module 170, a second interconnect management module 180, and a second bus interface 190. The first chiplet 110 and the second chiplet 160 may transmit and receive information and data to and from each other through the interconnect modules 140 and 170 and an interconnect interface 150. The interconnect modules 140 and 170 may be UCIe modules configured to communicate based on Universal Chiplet Interconnect Express (UCIe) standards, and may each include a controller and a PHY module.

While the internal configurations of the first chiplet 110 and the second chiplet 160 are illustrated in FIG. 1, it is to be noted that internal configurations other than those necessary to explain transmission and reception of information between the first chiplet 110 and the second chiplet 160 may be omitted. For example, the second chiplet 160 may further include another interconnect management module and another interconnect module connected to the second bus interface 190, thereby being further connected to another chiplet adjacent to the second chiplet 160. In addition, the first chiplet 110 and the second chiplet 160 may further include various functional modules for performing various functions (e.g., computation, recording, etc.).

The first interconnect management module 130 may include a first register 132, and the second interconnect management module 180 may include a second register 162. The registers 132 and 162 may store information associated with request transactions 112_1 and 112_2 and response transactions 152_1 and 152_2 for transaction tracking. The registers 132 and 162 may include a plurality of registers, and information stored in the registers will be described in detail below with reference to FIG. 5.

In response to the occurrence of the request transaction 112_1 associated with the second chiplet 160, the first interconnect management module 130 may store first information associated with the request transaction 112_1 in the first register 132. In this case, the first information may include information associated with a first time of occurrence of the request transaction 112_1 in the first chiplet 110 (or the first interconnect management module 130). The request transaction 112_1 may be generated by any module included in the first chiplet 110 and/or the host 192.

The request transaction 112_1 may be transferred to the second chiplet 160 through the first interconnect module 140 and the interconnect interface 150. In response to the occurrence of the request transaction 112_2, the second interconnect management module 180 may store second information associated with the request transaction 112_2 in the second register 162. The request transaction 112_2 may be the same as the request transaction 112_1 generated in the first chiplet 110, or may have addition or modification of the information of the request transaction 112_1. In this case, the second information may include information associated with a second time of occurrence of the request transaction 112_2.

The first interconnect management module 130 may determine the occurrence or non-occurrence of the request transaction timeout in the first chiplet 110 (or the first interconnect management module 130), based on whether or not the transfer of the request transaction 112_1 is completed before a predetermined threshold time elapses since the first time of occurrence of the request transaction 112_1 in the first chiplet 110. Likewise, the second interconnect management module 180 may determine the occurrence or non-occurrence of the request transaction timeout in the second chiplet 160 (or the second interconnect management module 180), based on whether or not the transfer of the request transaction 112_2 is completed before a predetermined threshold time elapses since the second time. Alternatively, the occurrence of the request transaction timeout in the first chiplet 110 or the second chiplet 160 may be determined by the host 192.

In response to the occurrence of the timeout of the request transactions 112_1 and 112_2 in the first chiplet 110 or the second chiplet 160, a transfer of the request transaction may be initiated again in the chiplet where the timeout occurs. For example, if the request transaction timeout occurs in the first chiplet 110, the first interconnect management module 130 and/or the module that generated the request transaction may initiate a transfer of the request transaction 112_1 again.

The request transactions 112_1 and 112_2 may be burst transactions transferred with a burst transfer method, and the request transaction timeout may occur in response to a part of the burst transaction not being transferred. A process in which the request transaction timeout occurs will be described in detail below with reference to FIGS. 6 and 7.

In response to the occurrence of the response transaction 152_1 corresponding to the request transaction 112_2, the second interconnect management module 180 may store third information associated with the response transaction 152_1 in the second register 162. For example, the response transaction 152_1 may be generated by any module in the second chiplet 160. In this case, the third information may include information associated with a third time of occurrence of the response transaction 152_1 in the second chiplet 160 (or the second interconnect management module 180).

The response transaction 152_1 may be transferred to the first chiplet 110 through the second interconnect module 170 and the interconnect interface 150. In response to the occurrence of the response transaction 152_2, the first interconnect management module 130 may store fourth information associated with the response transaction 1522 in the first register 132. The response transaction 1522 may be the same as the response transaction 1521 generated in the second chiplet 160, or may have addition or modification of information. In this case, the fourth information may include information associated with a fourth time of occurrence of the response transaction 152_2.

The first interconnect management module 130 may determine the occurrence or non-occurrence of the response transaction timeout in the first chiplet 110 (or the first interconnect management module 130), based on whether or not the transfer of the response transaction 152_2 corresponding to the request transaction 112_1 is completed before a predetermined threshold time elapses since the first time of occurrence of the request transaction 112_1 in the first chiplet 110. Likewise, the second interconnect management module 180 may determine the occurrence or non-occurrence of a response transaction timeout in the second chiplet 160 (or the second interconnect management module 180), based on whether or not the transfer of the response transaction 152_1 corresponding to the request transaction 112_2 is completed before the threshold time elapses since the second time of occurrence of the request transaction 112_2.

The response transactions 152_1 and 152_2 may be burst transactions transferred with a burst transfer method, and a response transaction timeout may occur in response to all or part of the burst transaction not being transferred. A process in which the response transaction timeout occurs will be described in detail below with reference to FIGS. 8 and 9.

At least one of the first chiplet 110 and the second chiplet 160 may further include an interconnect module configured to communicate with the host 192. At least one of the first chiplet 110 or the second chiplet 160 may communicate with the host 192 based on the Peripheral Component Interconnect Express (PCIe) standard, and the interconnect module configured to communicate with the host 192 may be a PCIe module.

The host 192 may receive an interrupt signal in response to the occurrence of a transaction timeout (request transaction timeout or response transaction timeout) in at least one of the first chiplet 110 or the second chiplet 160. The chiplet where the timeout occurs may generate an interrupt signal and transmit the interrupt signal to the host 192. In response to receiving the interrupt signal, the host 192 may access a register associated with the interconnect management module of the chiplet where the transaction timeout occurs.

The host 192 may determine a debugging point for which debugging is required, based on information stored in the accessed register. For example, the host 192 may determine one or more debugging point candidates and then determine debugging point(s) from among the one or more debugging candidates. The host 192 may initiate a process of resolving and recovering the problem for the determined debugging point. An example in which the debugging point is determined will be described below in detail with reference to FIG. 10.

Figure 2:
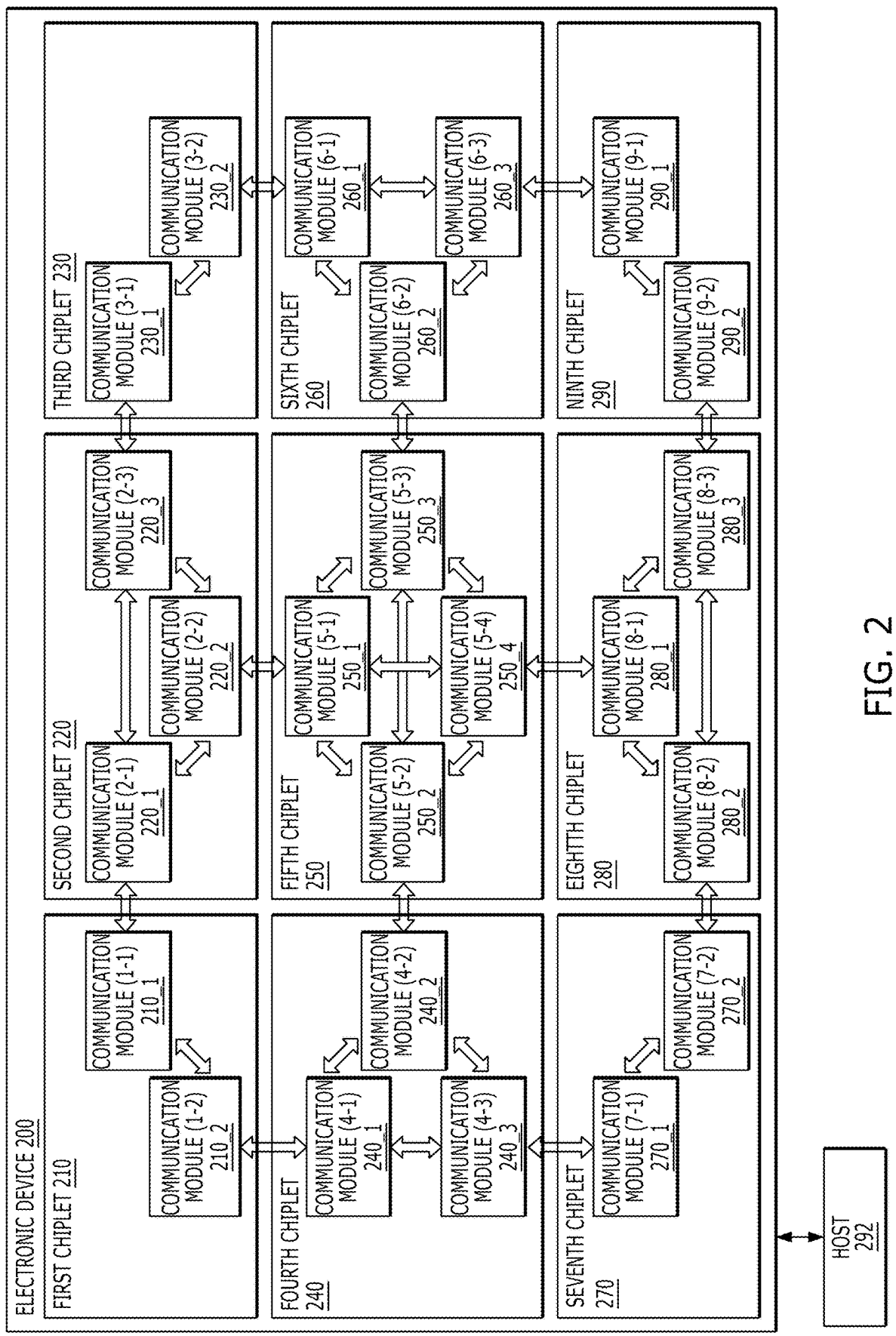
FIG. 2 is a diagram illustrating an example of an electronic device.

FIG. 2 is a diagram illustrating an example of an electronic device 200. Referring to FIG. 2, the electronic device 200 may include a plurality of chiplets. For example, the electronic device 200 may include a first chiplet 210, a second chiplet 220, a third chiplet 230, a fourth chiplet 240, a fifth chiplet 250, a sixth chiplet 260, a seventh chiplet 270, an eighth chiplet 280, and a ninth chiplet 290. However, the number of chiplets included in the electronic device 200 is not limited to the above. According to various aspects, the electronic device 200 may omit at least one of the chiplets described above, and may further include at least one more additional chiplet. In addition, the arrangement of chiplets included in the electronic device 200 is not limited to those illustrated herein, and the chiplets may be arranged in various other ways according to the purpose. The electronic device 100 including a plurality of chiplets may be packaged, and thus may be referred to as a packaged device or chiplet system.

Each of the plurality of chiplets may include various components such as a processing core, a memory, an input/output (I/O) interface, a power management circuit, a control logic, an Analog-to-Digital Converter (ADC), a Digital-to-Analog Converter (DAC), a memory, etc.

Each of the plurality of chiplets may include one or more communication modules. Each of the plurality of chiplets may include one or more communication modules capable of communicating with each of the other chiplets adjacent to each of the plurality of chiplets. For example, the first chiplet 210 may include a communication module (1-1) 210_1 and a communication module (1-2) 210_2, and the second chiplet 220 may include a communication module (2-1) 220_1, a communication module (2-2) 220_2, and a communication module (2-3) 220_3. In addition, the fifth chiplet 250 may include a communication module (5-1) 250_1, a communication module (5-2) 250_2, a communication module (5-3) 250_3, and a communication module (5-4) 250_4. A chiplet including the same number of communication modules may be implemented in the same architecture. For example, the fourth chiplet 240 and the sixth chiplet 260 may be implemented in the same architecture, but may be combined with different chiplets in different directions. For example, a communication module (4-1) 240_1 and a communication module (6-1) 260_1, a communication module (4-2) 240_2 and a communication module (6-2) 260_2, and a communication module (4-3) 240_3 and a communication module (6-3) 260_3 may correspond to each other.

Alternatively, each of the plurality of chiplets may include the same number of communication modules. For example, each of the plurality of chiplets included in the electronic device 200 as well as the fifth chiplet 250 may include four communication modules, and in FIG. 2, a communication module in a direction without an adjacent chiplet may be omitted for convenience of explanation.

The communication module may include a controller and a PHY layer. Additionally, the communication module may include the interconnect management module, the interconnect module, etc. of FIG. 1.

Each of the plurality of chiplets may be connected to each other through the communication module and the interconnect interface (indicated by an arrow between communication modules of different chiplets in FIG. 2). For example, the fifth chiplet 250 and the eighth chiplet 280 may be connected to each other via the communication module (5-4) 250_4, a communication module (8-1) 280_1, and an interface. The chiplet interconnect interface may refer to a die-to-die interface, and may include, for example, a Universal Chiplet Interconnect Express (UCIe), etc.

Each of the communication modules in a plurality of chiplets may be connected to each other through a bus interface (indicated by an arrow between communication modules in one chiplet in FIG. 2). For example, a communication module (3-1) 230_1 and a communication module (3-2) 230_2 in the third chiplet 230 may be connected to each other through a bus interface. Likewise, a communication module (9-1) 290_1 and a communication module (9-2) 290_2 in the ninth chiplet 290 may be connected to each other through a bus interface. Additionally, aspects are not limited to the communication between communication modules, and components in each chiplet may communicate with other components through a bus interface, etc. The bus interface may be an Advanced eXtensible Interface (AXI) type interface. For example, each of the communication modules in the plurality of chiplets may be connected to each other through an AXI master port and an AXI slave port, and each of the AXI master port and the AXI slave port may include a read port and a write port.

Information may be transmitted and received within the electronic device 200 using the communication module, the interconnect interface, and/or the bus interface of each of the plurality of chiplets. For example, when information is transmitted from the fourth chiplet 240 to the ninth chiplet 290, the information may be transmitted to the ninth chiplet 290 in the order of the communication module (4-3) 240_3, a communication module (7-1) 270_1, a communication module (7-2) 270_2, a communication module (8-2) 280_2, a communication module (8-3) 280_3, and a communication module (9-2) 290_2. Alternatively, when information is transmitted from the fourth chiplet 240 to the ninth chiplet 290, the information may be transmitted to the ninth chiplet 290 in the order of the communication module (4-2) 240_2, the communication module (5-2) 250_2, the communication module (5-3) 250_3, the communication module (6-2) 260_2, the communication module (6-3) 260_3, and the communication module (9-1) 290_1. The path for routing the information from a specific chiplet to another chiplet may be determined by the architecture of the chiplet system or may be determined by various routing algorithms such as the Dijkstra algorithm, the Bellman-Ford algorithm, etc., although aspects are not limited thereto.

Any one (e.g., the first chiplet 210) of the plurality of chiplets may be connected to an external device (e.g., a host 192) through a host interface. In this case, the other chiplets (e.g., the second chiplet 220, etc.) may be restricted from the communication with external device. The chiplet (e.g., the first chiplet 210) communicating with the external device may be referred to as a main chiplet, a primary die, a base chiplet, etc., and the other chiplets (e.g., the second chiplet 220, etc.) with restricted communication with the external device may be referred to as sub-chiplets, secondary dies, partner chiplets, etc. The host interface connecting a host 292 to the electronic device 200 or the main chiplet may include a Peripheral Component Interconnect Express (PCIe), etc.

The electronic device 200 including a plurality of chiplets, that is, the chiplet system may extend the functions of the host 292 (or the host system) and perform parallel processing for at least some functions. For example, the host 292 may manage the chiplet system and distribute tasks related to at least some functions to the chiplet system, and the chiplet system may process the distributed tasks in parallel. This not only enables the optimization and enhancement of the overall performance of the system including the host 292 and the chiplet system, but also provides a scalable computing environment. The chiplet system may perform functions of a multi-processor, a memory controller, a cache, a network interface, etc.

The electronic device 200 and the host 292 may correspond to the electronic device 100 and the host 192 of FIG. 1, respectively, and the first chiplet 210 and the second chiplet 220 may correspond to the first chiplet 110 and the second chiplet 160 of FIG. 1.

Figure 3:
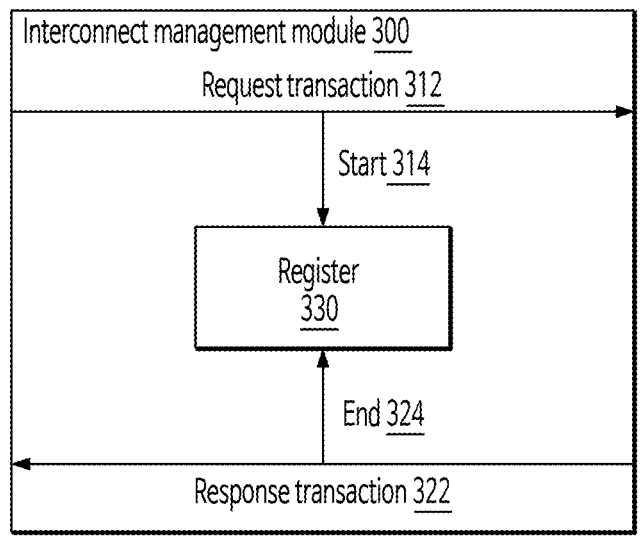
FIG. 3 is a diagram illustrating an example of a transaction tracking process using a register of an interconnect management module.

FIG. 3 is a diagram illustrating an example of a transaction tracking process using a register 330 of an interconnect management module 300. The interconnect management module 300 may be the first interconnect management module 130 or the second interconnect management module 180 of FIG. 1.

In response to the occurrence or the initiation of the transfer of a request transaction 312, the interconnect management module 300 may start/initiate 314 a transaction tracking process using the register 330. In response to the occurrence or the initiation of the transfer of a response transaction 322, the interconnect management module 300 may end 324 the transaction tracking process using the register 330.

At the start 314 of the tracking process, information associated with the request transaction 312 may be stored in the register 330. Likewise, at the end 324 of the tracking process, information associated with the response transaction 322 may be stored in the register 330. For example, the register 330 may store information associated with a time of occurrence of the request transaction 312 and information associated with a time of occurrence of the response transaction 322. The information stored in the register 330 may be transferred to another register of the same chiplet or to a register of another chiplet and stored therein. The information stored in the register 330 will be described in detail below with reference to FIG. 5.

The occurrence or non-occurrence of a timeout associated with the request transaction 312 and/or the response transaction 322 may be determined based on the information stored in the register 330. For example, the occurrence or non-occurrence of a timeout associated with the request transaction 312 and/or the occurrence or non-occurrence of a timeout associated with the response transaction 322 may be determined based on the information associated with the time of occurrence of the request transaction 312, which will be described in detail below using FIGS. 6 to 9.

When transactions (or information) are transmitted and received between chiplets in an electronic device including a plurality of chiplets, the tracking process may be performed in all chiplets through which the corresponding transaction is transferred. For example, if a transaction occurred in the first chiplet is transferred to the third chiplet via the second chiplet, the tracking process of the transaction may be performed using the register of the interconnect management module(s) included in each of the first, second, and third chiplets. As a result, the location where the timeout occurs may be determined, and a debugging point according to the timeout may be accurately determined.

Figure 4:
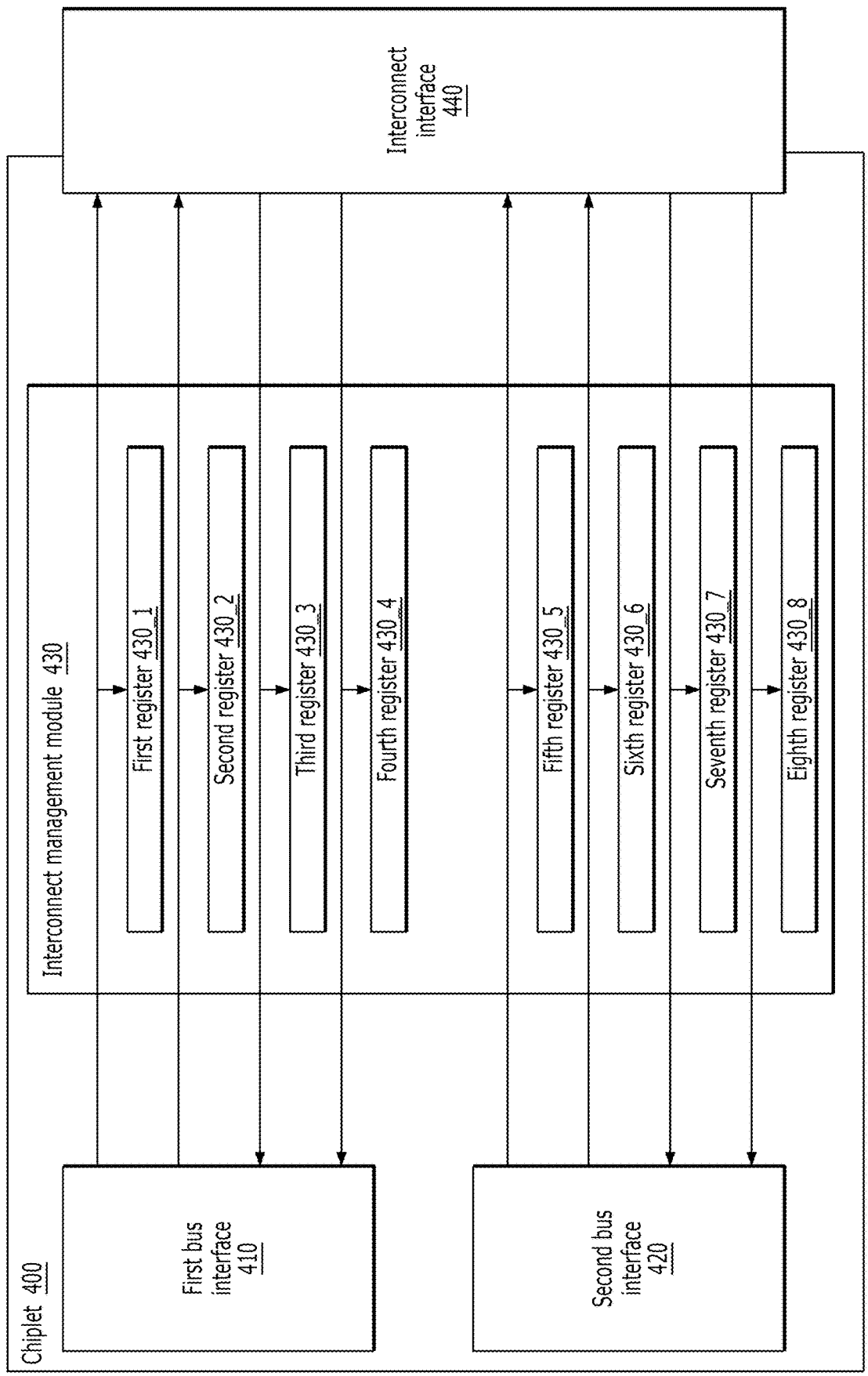
FIG. 4 is a diagram illustrating an example in which information is stored in a plurality of registers.

FIG. 4 is a diagram illustrating an example in which information is stored in a plurality of registers 430_1 to 430_8. Each of a chiplet 400, an interconnect management module 430, and an interconnect interface 440 illustrated in FIG. 4 may correspond to the first chiplet 110, the first interconnect management module 130, and the interconnect interface 150 of FIG. 1. In addition, a first bus interface 410 and a second bus interface 420 may be included in the first bus interface 120 of FIG. 1, and the registers 430_1 to 430_8 in the interconnect management module 430 may be included in the first register 132 of FIG. 1. Overlapping descriptions of the configurations in FIG. 4 corresponding to the configurations in FIG. 1 will be omitted.

Each of the first bus interface 410 and the second bus interface 420 in the chiplet 400 may be an advanced eXtensible interface (AXI) type interface. Each of the first bus interface 410 and the second bus interface 420 may include a plurality of ports. For example, the plurality of ports may include a read port and a write port, and each of the read port and write port may include a master port and a slave port. Different IDs may be assigned to each of the plurality of ports included in one bus interface, and different registers may be provided for different ports.

For example, the first register 430_1 may store information associated with a transaction transferred through a master read port, the second register 430_2 may store information associated with a transaction transferred through a slave write port, a third register 430_3 may store information associated with a transaction transferred through a master write port, and the fourth register 430_4 may store information associated with a transaction transferred through a slave read port. That is, the transaction tracking process may be individually performed on each of one or more ports of the bus interfaces 410 and 420.

The information stored in each of the plurality of registers 430_1 to 430_8 may be transferred to and stored in another register of the interconnect management module 430. For example, if information associated with the time of occurrence of the request transaction is stored in the first register 430_1, the information associated with the time of occurrence of the request transaction stored in the first register 430_1 may be transferred to and stored in the third register 430_3, and the information stored in the third register 430_3 may be the basis for determining the occurrence or non-occurrence of a timeout of a response transaction corresponding to the request transaction.

Figure 5:
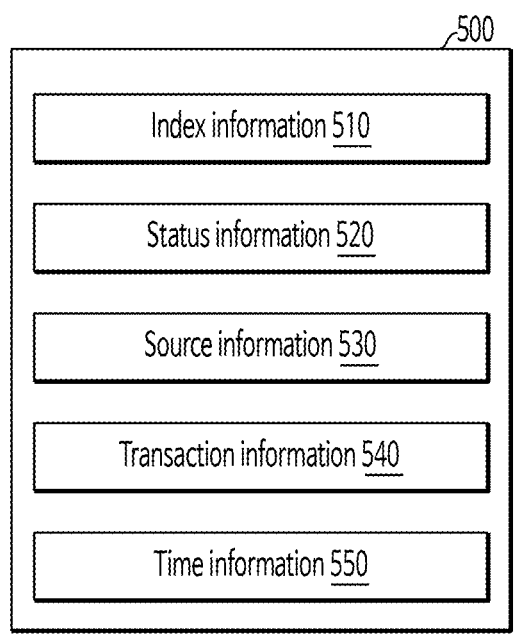
FIG. 5 is a diagram illustrating an example of information associated with a transaction stored in a register.

FIG. 5 is a diagram illustrating an example of information associated with a transaction stored in a register 500. The information associated with the transaction stored in the register 500 may be used when determining the occurrence or non-occurrence of a timeout in the tracking process of the transaction. Index information 510, status information 520, source information 530, transaction information 540, and time information 550 may be stored in the register 500, but aspects are not limited thereto, and some information may be additionally stored or omitted.

The index information 510 may include information of a bus interface connected to the register 500 (or an interconnect management module including the register 500). For example, the index information of the first register 430_1 of FIG. 4 may include information associated with the master read port of the first bus interface 410. Different identifiers/information may be assigned to different ports of the bus interface such that the index information 510 may have unique information in each register. That is, the index information 510 may be information for allowing the register 500 to be distinguished from the other registers.

The status information 520 may include transaction validity information, request transaction validity information, response transaction validity information, request transaction timeout occurrence information, response transaction timeout occurrence information, and/or error occurrence information during transmission and reception. This will be described in detail below with reference to FIGS. 7 and 9.

The source information 530 may include information associated with a source node where the transaction initially occurs and is transferred. For example, if a request transaction is initially generated in the first chiplet (source node) and transferred to the third chiplet through the second chiplet, the same source information may be included in all registers in the first chiplet, the second chiplet, and the third chiplet. The source information 530 may include information on a chiplet where the transaction initially occurs, information on a bus interface or port through which the transaction is transferred from the chiplet where the transaction initially occurs, interconnect management module information, etc. Additionally, the source information 530 may include information on a component in the source node where the transaction initially occurs.

The transaction information 540 may include information associated with a destination node to which the transaction is to be finally transferred. For example, if a transaction is initially generated in the first chiplet (source node) and then transferred to the third chiplet (destination node) through the second chiplet, the same information may be included in all registers in the first, second, and third chiplets. The information associated with the destination node may include information on a chiplet to which the transaction is to be finally transferred, information on a bus interface or port through which the transaction is to be transferred, information on an interconnect management module, etc. Additionally, the transaction information 540 may include information on a component in the destination node to which the transaction is to be finally transferred.

The time information 550 may include information associated with the time of occurrence of the transaction in the interconnect management module. The time information 550 may include information associated with a time when the transaction tracking starts or a time when the request transaction occurs, and information associated with a time when the transaction tracking ends or a time when a response transaction corresponding to the request transaction occurs. A process of determining the transaction timeout based on the time information 550 will be described in detail below with reference to FIGS. 6 and 8.

Figure 6:
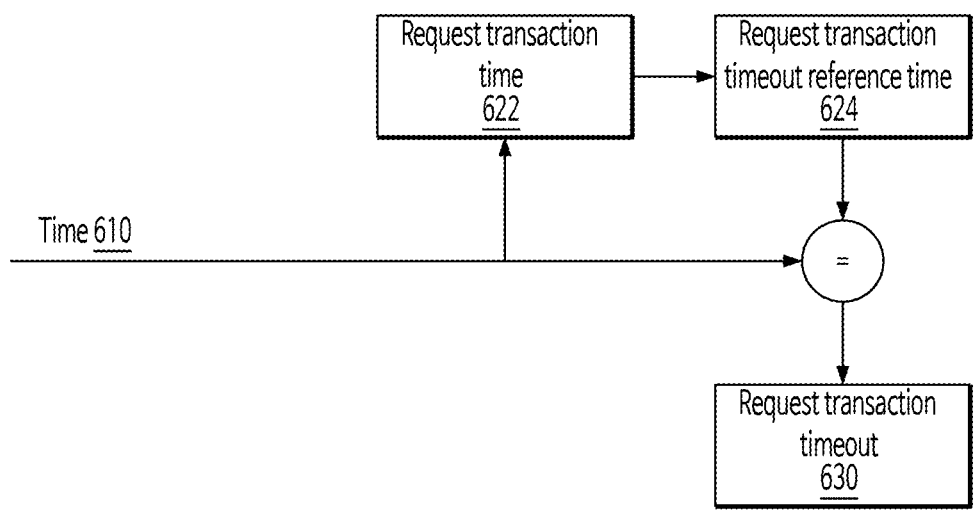
FIG. 6 is a diagram illustrating a process of determining a request transaction timeout.

FIG. 6 is a diagram illustrating a process of determining a request transaction timeout 630. The occurrence or non-occurrence of the request transaction timeout 630 may be determined by the interconnect management module of the chiplet where the request transaction occurs or by the host, but aspects are not limited thereto. A request transaction time 622 may be a time when the request transaction occurs for a transfer to another chiplet or to another component within the same chiplet, or a time of initiating a transfer from the bus interface to the interconnect interface connected to another chiplet.

A request transaction timeout reference time 624 may be determined based on the request transaction time 622. For example, the request transaction timeout reference time 624 may be a time point when a predetermined threshold time has elapsed since the request transaction time 622. The threshold time for determining the request transaction timeout reference time 624 may be determined based on various factors. For example, the threshold time may be determined based on a type of bus interface, a transfer speed, a transaction size, a system workload, user-defined parameters, etc.

The request transaction timeout 630 may occur in response to a time 610 matching the request transaction timeout reference time 624 (or exceeding the transaction timeout reference time 624).

The request transaction may be a burst transaction transferred with a burst transfer method, and the request transaction timeout 630 may occur in response to a part of the burst transactions not being transferred.

A debugging point may be determined in response to the occurrence of the request transaction timeout 630. This will be described in detail below with reference to FIG. 10.

In response to the occurrence of the request transaction timeout 630, an interrupt signal may be transferred to the host. In response to receiving the interrupt signal, the host may access a register associated with the interconnect management module of the chiplet where the transaction timeout occurs.

In response to the occurrence of the request transaction timeout 630, the transfer of the request transaction may be initiated again in the chiplet where the request transaction timeout 630 occurred. If the transfer of the request transaction is initiated again, the transfer of the request transaction may be initiated to be transferred to the destination node using the same path as the previous path. In another aspect, when the transfer of the request transaction is initiated again, the transfer of the request transaction may be initiated to be bypassed and transferred to the destination node using a chiplet different from the chiplet used for the transfer when the timeout occurred. For example, if a request transaction timeout occurs in the process of transferring the request transaction to the second chiplet 220 using the communication module (1-1) 210_1 and the communication module (2-1) 220_1 to transfer the request transaction from the first chiplet 210 to the fifth chiplet 250 of FIG. 2, the transfer of the same request transaction may be initiated again to bypass through the fourth chiplet 240 using the communication module (1-2) 210_2, the communication module (4-1) 240_1, the communication module (4-2) 240_2, and the communication module (5-2) 250_2.

Figure 7:
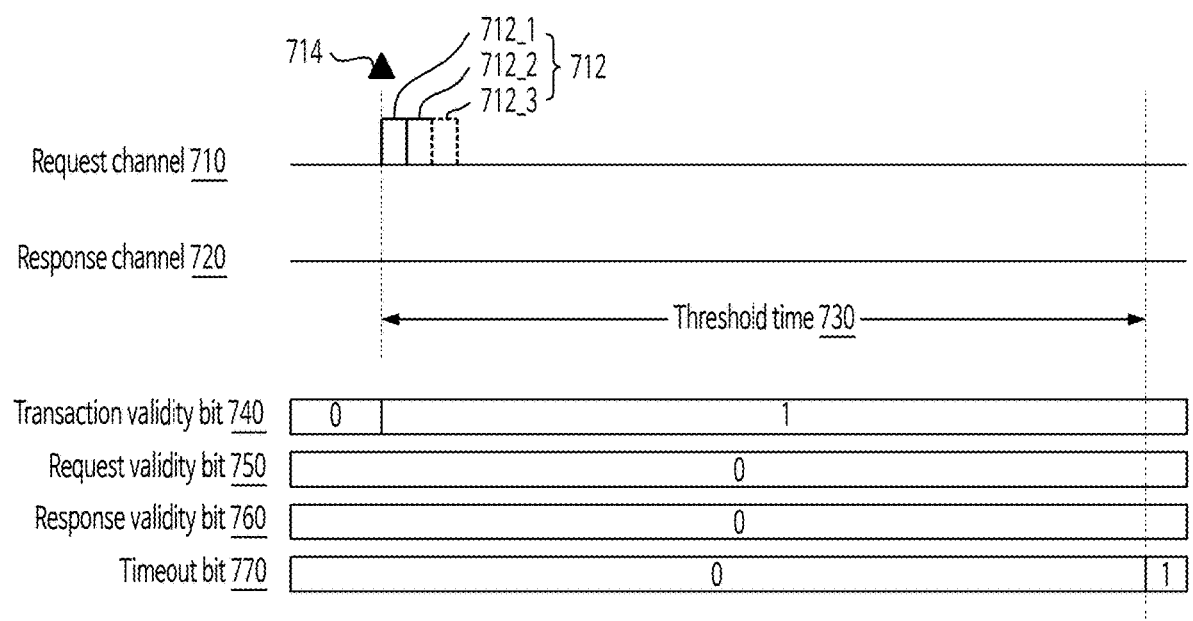
FIG. 7 is a diagram illustrating an example in which a request transaction timeout occurs.

FIG. 7 is a diagram illustrating an example in which a request transaction timeout occurs. A request channel 710 may refer to a channel in one chiplet through which a request transaction is transferred, and a response channel 720 may refer to a channel in the same chiplet through which a response transaction is transferred. In FIG. 7, values of bits 740, 750, 760, and 770 may change as the transaction is transferred and the changes in the values may be represented according to time change (toward the right). The information represented by the bits 740, 750, 760, and 770 may be included in the status information (e.g., the status information 520 of FIG. 5).

A request transaction 712 may be a burst transaction transferred with a burst transfer method. As illustrated in FIG. 7, the request transaction 712 may include a first data item 712_1, a second data item 712_2, and a third data item 712_3, but this is only an example provided for convenience of explanation, and aspects are not limited thereto. For example, there may be any number of data items included in the request transaction 712 which may be a burst transaction.

In response to the occurrence of the request transaction 712 (e.g., the occurrence of the first data item 712_1 of the request transactions 712), the transaction may be determined to be valid. For example, from a time 714 of occurrence of the request transaction 712, the value of the transaction validity bit 740 may be changed to 1.

The value of the request validity bit 750 indicating whether the request is validly transferred, and the occurrence or non-occurrence of the timeout of the request transaction 712 may be determined based on whether or not the transfer of the request transaction 712 is completed before a threshold time 730 elapses since the time 714 of occurrence of the request transaction 712. For example, if the transfer of all of the first data item 712_1, the second data item 712_2, and the third data item 712_3 included in the request transaction 712 are completed within the threshold time 730, the value of the request validity bit 750 may be determined to be "1" from the time the transfer is completed. On the other hand, as illustrated in FIG. 7, in response to at least a part of the request transaction 712 such as the third data item 712_3 not being transferred within the threshold time 730, the value of the request validity bit 750 may be maintained at "0". In addition, while the value of the request validity bit 750 is maintained at "0", from the time when the threshold time 730 elapsed, the value of the timeout bit 770 indicating the occurrence or non-occurrence of the timeout of the transaction may be changed to "1". Additionally, if the timeout of the request transaction 712 occurs, the value of the error bit (not illustrated) indicating the occurrence or non-occurrence of an error associated with the transaction may be changed from "0" to "1".

The value of the response validity bit 760 may be maintained at "0", because the transfer of the request transaction 712 in the request channel 710 is not completed and the response transaction corresponding to the request transaction 712 is not received from the response channel 720.

Figure 8:
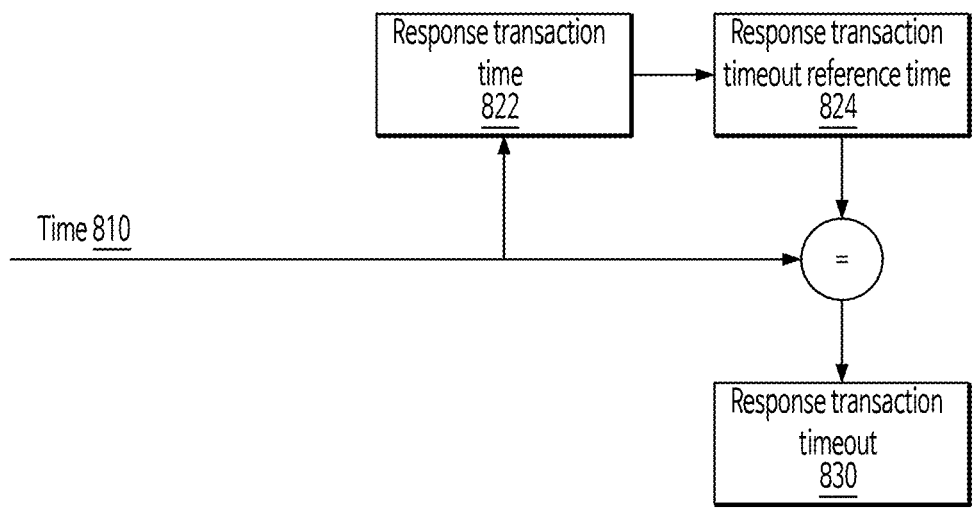
FIG. 8 is a diagram illustrating a process of determining a response transaction timeout.

FIG. 8 is a diagram illustrating a process of determining a response transaction timeout 830. The occurrence or non-occurrence of the response transaction timeout 830 may be determined by the interconnect management module of the chiplet where the response transaction occurs or by the host, but aspects are not limited thereto. A response transaction time 822 may be a time when the response transaction is received from another chiplet or from another component within the same chiplet, or a time of receiving from a bus interface to an interconnect interface connected to another chiplet.

A response transaction timeout reference time 824 may be determined based on the response transaction time 822. For example, the response transaction timeout reference time 824 may be a time point when a predetermined threshold time has elapsed from the response transaction time 822. The threshold time for determining the response transaction timeout reference time 824 may be determined based on various factors. For example, the threshold time may be determined based on a type of bus interface, a transfer speed, a transaction size, a system workload, user-defined parameters, etc.

The response transaction timeout 830 may occur as a time 810 elapses in response to the time 810 matching the response transaction timeout reference time 824 (or exceeding the transaction timeout reference time 824).

The response transaction may be a burst transaction transferred with a burst transfer method, and the response transaction timeout may occur in response to all or part of the burst transaction not being transferred.

A debugging point may be determined in response to the occurrence of the response transaction timeout 830. This will be described in detail below with reference to FIG. 10.

In response to the occurrence of the response transaction timeout 830, an interrupt signal may be transferred to the host. In response to receiving the interrupt signal, the host may access a register associated with the interconnect management module of the chiplet where the transaction timeout occurs.

In response to the occurrence of the response transaction timeout 830, the transfer of the response transaction may be initiated again in the chiplet where the response transaction timeout 830 occurred.

Figure 9:
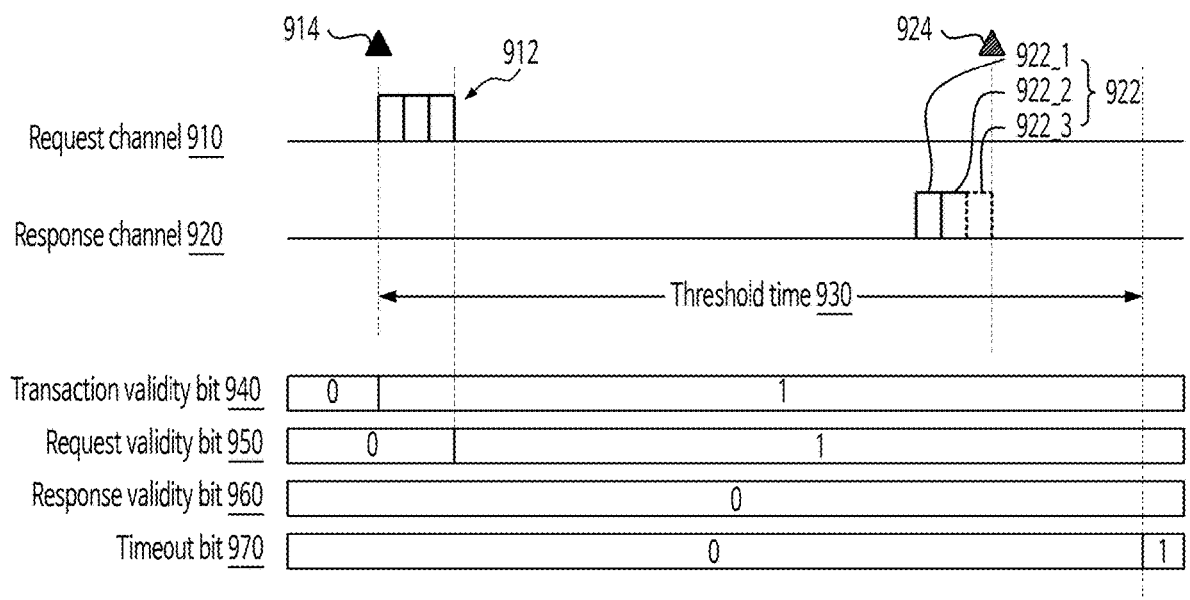
FIG. 9 is a diagram illustrating an example in which a response transaction timeout occurs.

FIG. 9 is a diagram illustrating an example in which a response transaction timeout occurs. A request channel 910 and a response channel 920 may correspond to the request channel 710 and the response channel 720 of FIG. 7. In FIG. 9, values of bits 940, 950, 960, and 970 may change as the transaction is transferred and the changes in the values may be represented according to time change (toward the right). The information represented by the bits 940, 950, 960, and 970 may be included in the status information (e.g., the status information 520 of FIG. 5).

In response to the occurrence of a request transaction 912 (e.g., the occurrence of a first data item of the request transactions 912), the transaction may be determined to be valid. For example, from a time 914 of occurrence of the request transaction 912, the value of the transaction validity bit 940 may be changed to 1.

As illustrated, in response to completing the transfer of the request transaction 912 before the threshold time elapses since the time 914 of occurrence of the request transaction 912, the value of the request validity bit 950 may be determined to be "1".

A response transaction 922 may be a burst transaction transferred with a burst transfer method. As illustrated in FIG. 9, the response transaction 922 may include a first data item 922_1, a second data item 922_2, and a third data item 9223, but this is only an example provided for convenience of explanation, and aspects are not limited thereto. For example, there may be any number of data items included in the response transaction 922 which may be a burst transaction.

The value of the response validity bit 960 indicating whether the response is validly transferred, and the occurrence or non-occurrence of the timeout of the response transaction 922 may be determined based on whether or not the response transfer of the response transaction 922 is completed before a threshold time 930 elapses since the time 914 of occurrence of the request transaction 912. For example, if a response time 924 at which the transfer of all of the first data item 922_1, the second data item 922_2, and the third data item 922_3 are completed is within the threshold time 930 from the time when the request transaction 912 occurs, from the response time 924, the value of the response validity bit 960 may be changed to "1". On the other hand, as illustrated in FIG. 9, in response to at least a part of the response transaction 922 such as the third data item 922_3 not being transferred within the threshold time 930, the value of the response validity bit 960 may be maintained at "0". While the value of the response validity bit 960 is maintained at "0", from the time when the threshold time 930 elapsed, the value of the timeout bit 970 indicating the occurrence or non-occurrence of the timeout of the transaction may be changed to "1". Additionally, if the timeout of the response transaction 922 occurs, the value of the error bit (not illustrated) indicating the occurrence or non-occurrence of an error associated with the transaction may be changed from "0" to "1".

Figure 10:
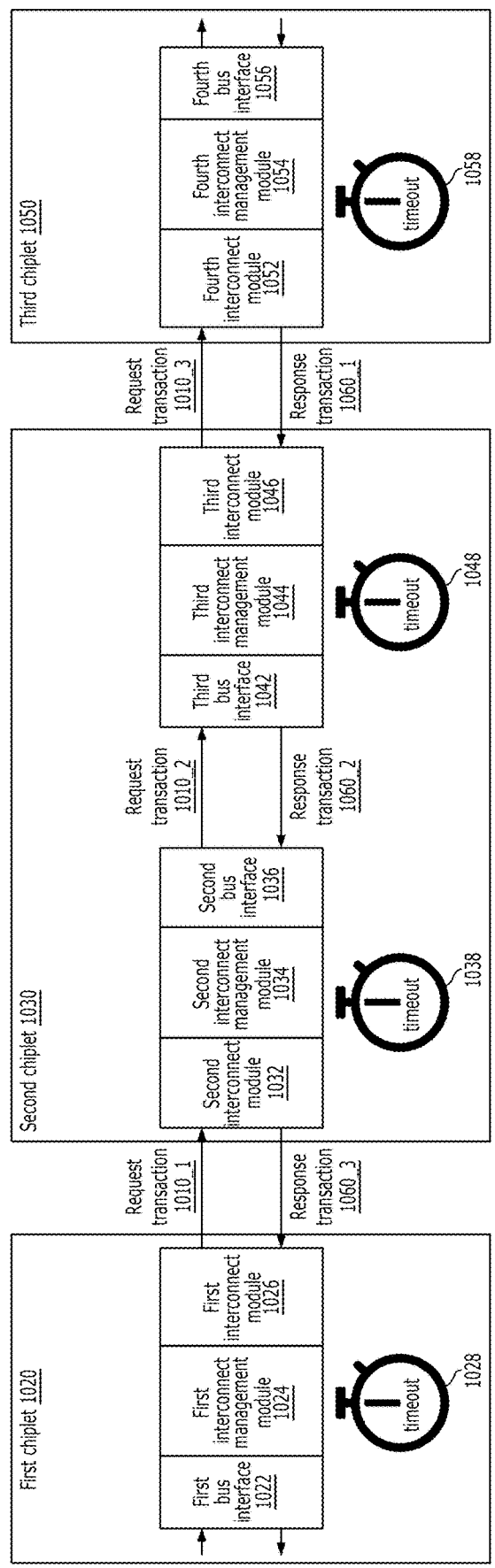
FIG. 10 is a diagram illustrating an example in which a timeout occurs.

FIG. 10 is a diagram illustrating an example in which timeouts 1028, 1038, 1048, and 1058 occur. A request transaction 1010 may be transferred from a first chiplet 1020 (source node) to a third chiplet 1050 (destination node) via a second chiplet 1030 (relay node). A response transaction 1060 associated with the request transaction 1010 may be transferred from the third chiplet 1050 to the first chiplet 1020 via the second chiplet 1030. FIG. 10 illustrates that the request transaction 1010 and the response transaction 1060 are transferred through one relay node, but aspects are not limited thereto, and these transactions may be transferred through any number of relay nodes.

The transactions 1010 and 1060 may be transmitted and received between the chiplets using interconnect modules 1026, 1032, 1046, and 1052 in the chiplets 1020, 1030, and 1050. In this process, information associated with the transactions 1010 and 1060 may be stored in the interconnect management modules 1024, 1034, 1044, and 1054 (or in the registers within the interconnect management modules). Bus interfaces 1022, 1036, 1042, and 1056 may be connected to other components in the chiplet (e.g., processing cores, CPUs, memories, communication modules, etc.).

In FIG. 10, the timeouts 1028, 1038, 1048, and 1058 may represent the request transaction timeouts or the response transaction timeouts. The first timeout 1028 may represent a timeout occurring in the process of transferring the request transaction 1010_1 from the first chiplet 1020 to the second chiplet 1030 or receiving the response transaction 1060_3 using the first interconnect module 1026 and the second interconnect module 1032. The second timeout 1038 may represent a timeout occurring in the second interconnect management module 1034 in the process of transferring the request transaction 1010_2 or receiving the response transaction 1060_2. The third timeout 1048 may represent a timeout occurring in the third interconnect management module 1044 in the process of transferring the request transaction 1010_3 or receiving the response transaction 1060_1. The fourth timeout 1058 may represent a timeout occurring in the fourth interconnect management module 1054 in the process of transferring a request transaction or receiving a response transaction. For example, the fourth timeout 1058 may represent a timeout occurring in the process of transferring a request transaction to an internal component of the third chiplet 1050, or receiving a response transaction from an internal component, or transferring a response transaction to the second chiplet 1030. That is, the first timeout 1028, the second timeout 1038, the third timeout 1048, and the fourth timeout 1058 may represent the timeouts determined based on information associated with transactions stored in the first interconnect management module 1024, the second interconnect management module 1034, the third interconnect management module 1044, and the fourth interconnect management module 1054, respectively.

If the first timeout 1028 is a timeout associated with the request transaction 1010_1, it may be estimated that the timeout occurs due to a communication failure of the bus interface (e.g., the first bus interface 1022) connected to the first interconnect management module 1026, and the first bus interface 1022 may be determined as a debugging point. If the third timeout 1048 is a timeout associated with the request transaction 1010_3, a bus interface (e.g., the third bus interface 1042) connected to the first interconnect management module 1046 may be determined as a debugging point (or a debugging point candidate).

If the second timeout 1038 is a timeout associated with the request transaction 1010_2, an interconnect interface (e.g., a UCIe link) between the second interconnect management module 1034 and the interconnect management module (e.g., the first interconnect module 1024) of the first chiplet 1020 which is a source node, may be determined as a debugging point candidate. If the fourth timeout 1058 is a timeout associated with the request transaction, an interconnect interface (e.g., a UCIe link) between the fourth interconnect management module 1054 and the interconnect management module (e.g., the third interconnect management module 1044) of the second chiplet 1030 which is a relay node, may be determined as a debugging point (or a debugging point candidate).

If the fourth timeout 1058 is a timeout associated with the response transaction, a bus interface (e.g., the fourth bus interface 1056) connected to the fourth interconnect management module 1054 may be determined as a debugging point candidate. If the second timeout 1038 is a timeout associated with the response transaction, a bus interface (e.g., the second bus interface 1036) connected to the second interconnect management module 1034 may be determined as a debugging point candidate.

If the third timeout 1048 is a timeout associated with the response transaction, an interconnect interface (e.g., a UCIe link) between the third interconnect management module 1044 and the interconnect management module (the fourth interconnect management module 1054) of the third chiplet 1050 which is a destination node, may be determined as a debugging point candidate. If the first timeout 1028 is a timeout associated with a response transaction, an interconnect interface (e.g., a UCIe link) between the first interconnect management module 1024 and the interconnect management module (e.g., the second interconnect management module 1034) of the second chiplet 1030 which is a relay node, may be determined as a debugging point candidate.

The final debugging point may be determined based on the determined debugging point candidate. For example, if a response transaction timeout occurs in the third chiplet 1050, some or all of the response transactions are not transferred to the next path, sequentially resulting in occurrence of response transaction timeouts in the second chiplet 1030 and the first chiplet 1020 and determination of multiple debugging point candidates in the response channel. In this case, any of the multiple debugging point candidates that first receives or transfers a response transaction in the transfer path of the response transaction may be determined as the final debugging point.

If some request timeouts occur, the debugging point may be determined according to Table 1 below.

TABLE 1

| Request Timeout Occurrence Point | Debugging Point |
|---|---|
| Interconnect management module for destination node | Interconnect interface (e.g., UCIe link) between corresponding interconnect management module and interconnect management module of source node or relay node |
| Interconnect management node close to destination node among interconnect management nodes of relay node | Bus interface of relay node connected to corresponding interconnect management module |
| Interconnect management node close to source node among interconnect management nodes of relay node | Interconnect interface (e.g., UCIe link) between corresponding interconnect management module and interconnect management module of source node or another relay node |
| Interconnect management module for source node | Bus interface connected to corresponding interconnect management module |

If some or all response timeouts occur, the debugging point may be determined according to Table 2 below.

TABLE 2

| Response Timeout Occurrence Point | Debugging Point |
|---|---|
| Interconnect management module for destination node | Bus interface of destination node connected to corresponding interconnect management module |
| Interconnect management node close to destination node among interconnect management nodes of relay node | Interconnect interface (e.g., UCIe link) between corresponding interconnect management module and interconnect management module of destination node or another relay node |
| Interconnect management node close to source node among interconnect management nodes of relay node | Bus interface of relay node connected to corresponding interconnect management module |
| Interconnect management module for source node | Interconnect interface (e.g., UCIe link) between corresponding interconnect management module and interconnect management module of destination node or relay node |

The method described above may be provided as a computer program stored in a computer-readable recording medium for execution on a computer. The medium may be a type of medium that continuously stores a program executable by a computer, or temporarily stores the program for execution or download. In addition, the medium may be a variety of recording means or storage means having a single piece of hardware or a combination of several pieces of hardware, and is not limited to a medium that is directly connected to any computer system, and accordingly, may be present on a network in a distributed manner. An example of the medium includes a medium configured to store program instructions, including a magnetic medium such as a hard disk, a floppy disk, and a magnetic tape, an optical medium such as a CD-ROM and a DVD, a magnetic-optical medium such as a floptical disk, a ROM, a RAM, a flash memory, etc. In addition, other examples of the medium may include an app store that distributes applications, a site that supplies or distributes various software, and a recording medium or a storage medium managed by a server. The methods, operations, or techniques of the present disclosure may be implemented by various means. For example, these techniques may be implemented in hardware, firmware, software, or a combination thereof. Those skilled in the art will further appreciate that various illustrative logical blocks, modules, circuits, and algorithm steps described in connection with the disclosure herein may be implemented in electronic hardware, computer software, or combinations of both. To clearly illustrate this interchange of hardware and software, various exemplary components, blocks, modules, circuits, and steps have generally been described above from their functional perspective. Whether such a function is implemented as hardware or software depends on design requirements imposed on the particular application and the overall system. Those skilled in the art may implement the described functions in varying ways for each particular application, but such implementation should not be interpreted as causing a departure from the scope of the present disclosure.

In a hardware implementation, processing units used to perform the techniques may be implemented in one or more ASICs, DSPs, digital signal processing devices (DSPDs), programmable logic devices (PLDs), field programmable gate arrays (FPGAs), processors, controllers, microcontrollers, microprocessors, electronic devices, other electronic units designed to perform the functions described in the present disclosure, computer, or a combination thereof.

Accordingly, various example logic blocks, modules, and circuits described in connection with the present disclosure may be implemented or performed with general purpose processors, DSPs, ASICs, FPGAs or other programmable logic devices, discrete gate or transistor logic, discrete hardware components, or any combination of those designed to perform the functions described herein. The general purpose processor may be a microprocessor, but in the alternative, the processor may be any related processor, controller, microcontroller, or state machine. The processor may also be implemented as a combination of computing devices, for example, a DSP and microprocessor, a plurality of microprocessors, one or more microprocessors associated with a DSP core, or any other combination of the configurations.

In the implementation using firmware and/or software, the techniques may be implemented with instructions stored on a computer-readable medium, such as random access memory (RAM), read-only memory (ROM), non-volatile random access memory (NVRAM), programmable read-only memory (PROM), erasable programmable read-only memory (EPROM), electrically erasable PROM (EEPROM), flash memory, compact disc (CD), magnetic or marking data storage devices, etc. The commands may be executable by one or more processors, and may cause the processor(s) to perform certain aspects of the functions described in the present disclosure.

If implemented in software, the techniques described above may be stored on a computer-readable medium as one or more commands or codes, or may be sent via a computer-readable medium. The computer-readable media include both the computer storage media and the communication media including any medium that facilitates the transmission of a computer program from one place to another. The storage media may also be any available media that may be accessible to a computer. By way of non-limiting example, such a computer-readable medium may include RAM, ROM, EEPROM, CD-ROM or other optical disk storage, magnetic disk storage or other magnetic storage devices, or any other media that can be used to transmit or store desired program code in the form of instructions or data structures and can be accessible to a computer. In addition, any connection is properly referred to as a computer-readable medium.

For example, if the software is sent from a website, server, or other remote sources using coaxial cable, fiber optic cable, twisted pair, digital subscriber line (DSL), or wireless technologies such as infrared, wireless, and microwave, the coaxial cable, the fiber optic cable, the twisted pair, the digital subscriber line, or the wireless technologies such as infrared, wireless, and microwave are included within the definition of the medium. The disks and the discs used herein include CDs, laser disks, optical disks, digital versatile discs (DVDs), floppy disks, and Blu-ray disks, where disks usually magnetically reproduce data, while discs optically reproduce data using a laser. The combinations described above should also be included within the scope of the computer-readable media.

The software module may reside in RAM memory, flash memory, ROM memory, EPROM memory, EEPROM memory, registers, hard disk, removable disk, CD-ROM, or any other form of storage medium known. An exemplary storage medium may be connected to the processor, such that the processor may read or write information from or to the storage medium. Alternatively, the storage medium may be integrated into the processor. The processor and the storage medium may be present in the ASIC. The ASIC may be present in the user terminal. Alternatively, the processor and storage medium may exist as separate components in the user terminal.

Although the examples described above have been described as utilizing aspects of the currently disclosed subject matter in one or more standalone computer systems, aspects are not limited thereto, and may be implemented in conjunction with any computing environment, such as a network or distributed computing environment. Furthermore, the aspects of the subject matter in the present disclosure may be implemented in multiple processing chips or devices, and storage may be similarly influenced across a plurality of devices. Such devices may include PCs, network servers, and portable apparatus.

Although the present disclosure has been described in connection with some aspects herein, various modifications and changes can be made without departing from the scope of the present disclosure, which can be understood by those skilled in the art to which the present disclosure pertains. In addition, such modifications and changes should be considered to fall within the scope of the claims appended herein.

The invention claimed is:

1. An electronic device, comprising:
   a first chiplet comprising a first bus interface, a first interconnect management module, and a first interconnect module; and
   a second chiplet connected to the first chiplet through the first interconnect module,
   wherein, in response to an occurrence of a request transaction associated with the second chiplet, the first interconnect management module stores first information associated with the request transaction in a register,
   wherein the first information comprises information associated with a first time of occurrence of the request transaction in the first interconnect management module, and
   the first interconnect management module determines occurrence or non-occurrence of a request transaction timeout in the first chiplet, based on whether a transfer of the request transaction is completed before a first threshold time elapses since the first time, and
   in response to determining that the request transaction timeout occurs in the first chiplet, the first bus interface is determined as a debugging point candidate.

2. The electronic device according to claim 1, wherein the request transaction is a burst transaction transferred with a burst transfer method, and
   the request transaction timeout occurs in response to a part of the burst transaction not being transferred.

3. The electronic device according to claim 1, wherein the request transaction is transferred to the second chiplet through the first interconnect module.

4. The electronic device according to claim 3, wherein the first interconnect management module determines occurrence or non-occurrence of a response transaction timeout in the first chiplet, based on whether a transfer of a response transaction corresponding to the request transaction is completed before a second threshold time elapses since the first time, and
   the response transaction is transferred from the second chiplet to the first chiplet through the first interconnect module.

5. The electronic device according to claim 4, wherein the response transaction is a burst transaction transferred with a burst transfer method, and
   the response transaction timeout occurs in response to all or a part of the burst transaction not being transferred.

6. The electronic device according to claim 3, wherein the second chiplet includes a second bus interface, a second interconnect management module, and a second interconnect module, and
   in response to the occurrence of the request transaction, the second interconnect management module stores, in a register, second information associated with the request transaction.

7. The electronic device according to claim 6, wherein the second information includes information associated with a second time of occurrence of the request transaction in the second interconnect management module, and
   the second interconnect management module determines occurrence or non-occurrence of a request transaction timeout in the second chiplet, based on whether a transfer of the request transaction is completed before a second threshold time elapses since the second time.

8. The electronic device according to claim 7, wherein, in response to determining the occurrence of the request transaction timeout in the second chiplet, the second interconnect module is determined as a debugging point candidate.

9. The electronic device according to claim 6, wherein the second information includes information associated with a second time of occurrence of the request transaction in the second interconnect management module, and
   the second interconnect management module determines occurrence or non-occurrence of a response transaction timeout in the second chiplet, based on whether a transfer of a response transaction corresponding to the request transaction is completed before a second threshold time elapses since the second time.

10. The electronic device according to claim 9, wherein, in response to determining the occurrence of the response transaction timeout in the second chiplet, the second bus interface is determined as a debugging point candidate.

11. The electronic device according to claim 3, wherein, in response to occurrence of a timeout associated with the request transaction in the first chiplet or the second chiplet, a transfer of the request transaction is initiated again in the chiplet where the timeout occurs.

12. The electronic device according to claim 1, wherein the first interconnect module is configured to communicate based on a first protocol, and
    at least one of the first or second chiplet comprises a second interconnect module, which is configured to communicate with a host based on a second protocol.

13. The electronic device according to claim 12, wherein the first interconnect module is a Universal Chiplet Interconnect Express (UCIe) module, and
    the second interconnect module is a Peripheral Component Interconnect Express (PCIe) module.

14. The electronic device according to claim 1, wherein the first bus interface is an advanced eXtensible interface (AXI) type interface.

15. An electronic device, comprising:
    a first chiplet comprising a first bus interface, a first interconnect management module, and a first interconnect module; and
    a second chiplet connected to the first chiplet through the first interconnect module,
    wherein, in response to an occurrence of a request transaction associated with the second chiplet, the first interconnect management module stores specific information associated with the request transaction in a register,
    the request transaction is transferred to the second chiplet through the first interconnect module,
    the specific information comprises information associated with a specific time of occurrence of the request transaction,
    the first interconnect management module determines occurrence or non-occurrence of a response transaction timeout in the first chiplet, based on whether a transfer of a response transaction corresponding to the request transaction is completed before a specific threshold time elapses since the specific time, and
    the response transaction is transferred from the second chiplet to the first chiplet through the first interconnect module,
    in response to determining the occurrence of the response transaction timeout in the first chiplet, the first interconnect module is determined as a debugging point candidate.

16. An electronic device, comprising:

a first chiplet comprising a first bus interface, a first interconnect management module, and a first interconnect module; and a second chiplet connected to the first chiplet through the first interconnect module, wherein, in response to an occurrence of a request transaction associated with the second chiplet, the first interconnect management module stores specific information associated with the request transaction in a register, the first interconnect module is configured to communicate based on a first protocol, and at least one of the first or second chiplet comprises a second interconnect module, which is configured to communicate with a host based on a second protocol, wherein, an interrupt signal is transferred to the host in response to an occurrence of a transaction timeout in at least one of the first or second chiplets.

17. The electronic device according to claim 16, wherein, in response to receiving the interrupt signal, the host accesses a register associated with an interconnect management module of the chiplet where the transaction timeout occurs.

18. The electronic device according to claim 16, wherein a register associated with an interconnect management module of the chiplet where the timeout occurs comprises at least one of: information associated with the chiplet where the timed-out transaction is generated; information associated with an interconnect management module of the chiplet where the transaction is generated, or information associated with a bus interface through which the transaction is passed.

* * * * *